United States Patent [19]
Petropoulos et al.

[11] Patent Number: 6,078,177
[45] Date of Patent: Jun. 20, 2000

[54] FLARED GRADIENT COIL SET WITH A FINITE SHIELD CURRENT

[75] Inventors: Labros S. Petropoulos, Solon; Junxiao Ling, University Heights, both of Ohio

[73] Assignee: Picker International, Inc., Highland Heights, Ohio

[21] Appl. No.: 09/002,946

[22] Filed: Jan. 5, 1998

[51] Int. Cl.$^7$ ........................................... G01V 3/00
[52] U.S. Cl. ........................ 324/318; 324/322; 600/410; 600/422; 335/301
[58] Field of Search .................................... 324/318, 322, 324/320; 600/422, 410; 335/301, 316, 299, 216

[56] References Cited

U.S. PATENT DOCUMENTS

| | | | |
|---|---|---|---|
| 5,378,989 | 1/1995 | Barber et al. | 324/318 |
| 5,485,087 | 1/1996 | Morich et al. | 324/318 |
| 5,497,089 | 3/1996 | Lampman et al. | 324/318 |

OTHER PUBLICATIONS

"Design Criteria for a Folded Gradient Coil," Apr. 1997, Schenck, et al.

*Primary Examiner*—Christine K. Oda
*Assistant Examiner*—Brij B. Shrivastav
*Attorney, Agent, or Firm*—Fay, Sharpe, Fagan, Minnich & McKee, LLP

[57] ABSTRACT

A method of designing a shielded gradient coil assemblies (22) with a flared primary coil (60) for magnetic resonance imaging systems is provided. The method includes generating a first continuous current distribution for a primary coil (60) using an inverse approach. The first continuous current distribution is confined within predetermined finite geometric boundaries of a surface defined by three dimensions and generates a magnetic gradient field across an imaging region (14). The magnetic gradient field is constrained to predetermined values at specified spatial locations within the imaging region (14). The current distribution and magnetic field are converted into a stored energy and magnetic field domain where a finite element analysis is performed to generate a second continuous current distribution for a shielding coil (62). The second continuous current distribution is confined within predetermined finite geometric boundaries of a surface surrounding the primary coil (60). The second continuous current distribution generates a magnetic field which substantially cancels in an area outside a region defined by the shielding coil a fringe magnetic field generated by the first continuous current density.

15 Claims, 8 Drawing Sheets

FLARED GRADIENT COIL SET WITH A FINITE SHIELD CURRENT

BACKGROUND OF THE INVENTION

The present invention relates to the art of electromagnetic shielding. It finds particular application in conjunction with gradient coils for magnetic resonance imaging apparatus and will be described with particular reference thereto. However, it is to be appreciated that the present invention also finds application in conjunction with systems which employ gradient magnetic fields and other applications in which electromagnetic shielding is desired.

In a magnetic resonance imaging system, gradient coil assemblies are commonly pulsed with electrical current pulses to produce magnetic gradients across the main magnetic field in the vicinity of an imaging region. As an unwanted side effect, magnetic field gradients are produced which interact with external metallic structures such as the magnet cold shields, the magnet dewar, and the like. The interaction generates eddy currents in the effected structures. These eddy currents, in turn, generate eddy magnetic fields which have a deleterious effect on the temporal and spatial quality of the magnetic field in the vicinity of the imaging region and, hence, in the resultant image quality.

The eddy current problem is often addressed by placing an active shielding coil between the primary gradient coil and the effected structure. The shielding coils are designed to substantially zero or cancel the magnetic field external to itself thereby preventing the formation of eddy currents in potentially vulnerable structures.

Previously methods for production for magnetic gradients in magnetic resonance imaging systems consisted of winding discrete coils in a bunched or distributed fashion on an electrically insulating hollow cylindrical former and driving the coils with a current source of limited voltage. Conventional bunched coil designs include the Maxwell and the Modified Maxwell Pair for z-gradient production, and the Golay or Modified Golay (multi-arc) Saddle Coils for x and/or y-gradient production. Typically, these methods consisted of iteratively placing coil loops or arcs on the cylindrical former until the desired gradient strength, gradient uniformity, and inductance (related to stored energy) were achieved. These previous designs were generally developed in a "forward approach" whereby a set of initial coil positions were defined (i.e., the initial coil distribution), the fields and the inductance/energy calculated, and if not within particular design parameters, the coil positions would be shifted (statistically or otherwise) and results re-evaluated. The iterative procedure continued until a suitable design was obtained.

More recent methods of generating magnetic fields in magnetic resonance imaging systems utilize an "inverse approach." In the "inverse approach" method, the gradient magnetic field is forced to match predetermined values at specified spatial locations inside the imaging volume and a continuous current density is calculated which is capable of producing such a field. The "inverse approach" method assumes that the primary gradient coil has finite dimensions while those of the secondary or shield coil are left unrestricted (infinite). After the generation of continuous current distributions for both the primary and the shield coils, an apodization algorithm is performed on the continuous current density of the shield coil in order to restrain it to desirable dimensions. Following the modification of the shielding coil's continuous current, the Stream Function technique is employed in order to obtain discrete current patterns for both coils. Application of the Biot-Savart law to the discrete current pattern ensures that the discretization procedure was proper. This approach created generally more energy efficient gradient coil assemblies with higher gradient strengths and faster slew rates as compared to the "forward approach" method.

In certain applications, for example imaging of the head, it is desirable to maintain the sweet spot of the gradient coil assembly at a predetermined location corresponding to a particular anatomy of interest. However, due to a subject's surrounding anatomy (the subject's shoulders in this case) the gradient coil assembly can not be appropriately centered. That is to say, when the gradient coil assembly's diameter is large enough to encompass a subject's shoulders it is too far radially from the subject's head, and conversely, when the diameter is sufficiently close to the head, the shoulders interfere with an end of the coil such that the isocenter of the gradient coil is not properly aligned with the area of interest in the head. Shortening the length of the gradient coil so that the shoulders of a subject do not come into play reduces the usable imaging volume and deteriorates linearity. Attempts to adjust the sweet spot of the coil by means of a non-symmetric gradient coil assembly runs afoul of high torques generated by the interaction of the main magnetic field with the currents of the gradient coil assembly and less desirable gradient fields. One approach used to address the issue, was to employ a symmetrical cylindrical gradient coil assembly with flared ends that could accommodate a subject's shoulders. Added benefits of the flared design are increased patient access and reduced claustrophobia. However, heretofore shielding for this flared design has been lacking.

In one particular approach discussed in U.S. Pat. No. 5,497,089 to Lampman et al., an insertable cylindrically shaped gradient coil assembly is presented with flared ends. However, the gradient coil assembly is not shielded. In this case, eddy current effects not suppressed by shielding prohibit the use of fast imaging sequences that are particularly sensitive thereto.

Another particular gradient coil assembly is presented in a paper by Schenck et al., "Design Criteria for a Folded Gradient Coil", 5th ISMRM (Vancouver, Canada), April 1997, pg. 1468. The paper presents a design methodology for a flared shielded gradient coil using the "forward approach". The design model presented assumed a series connection between the primary and shield coils such that they share the same current. This design resulted in inadequate shielding as compared to a traditional shielded design.

U.S. Pat. No. 5,378,989 to Barber et al. presents yet another flared gradient coil assembly for use with open magnet systems. However, the flared portions are not at the ends of a cylindrical coil. Rather, the flared portions are near the isocenter. This prohibits the assembly from being used with a closed bore magnet. Furthermore, the design restricts the flare to a 90° angle and is based on a "forward approach" which results in decreased performance.

For interventional procedures and like applications where patient access is desirable, it is advantageous to design the gradient shielding coil such that its dimensions do not exceed those of the flared primary gradient coil. In this manner, patient access can be maximized and the feeling of openness can reduce patient claustrophobia. However, in general, previous methods and prior art suffer the drawback that as the shielding coil length approaches that of the primary coil, increased levels of eddy current effects within the imaging region deteriorate image quality. Conversely, when sufficient shielding is achieved, the dimensions of the shielding coil are substantially larger than those of the primary coil such that the level of patient access is encumbered and an increased level of patient claustrophobia is experienced.

The present invention contemplates a new and improved shielded gradient coil assembly and method for designing such which overcomes the above-referenced problems and others.

SUMMARY OF THE INVENTION

In accordance with one aspect of the present invention, a method of designing shielded gradient coil assemblies for magnetic resonance imaging systems is provided. The method includes calculating a first continuous current distribution for a three dimensional construction using an inverse approach. The first continuous current distribution is confined within predetermined finite geometric boundaries of the three dimensional construction and generates a magnetic gradient field across an imaging region. The magnetic gradient field is constrained to predetermined values at specified spatial locations within the imaging region. Thereafter, a second continuous current distribution for a shielding coil is calculated using finite element analysis. The second continuous current distribution is confined within predetermined finite geometric boundaries of the shielding coil. The second continuous current distribution generates a magnetic field which substantially cancels in an area outside a region defined by the shielding coil a fringe magnetic field generated by the first continuous current density.

In accordance with a more limited aspect of the present invention, the shielding coil has an axial length substantially equal to or less than that of the primary coil.

In accordance with a more limited aspect of the present invention, the first and second continuous current distributions are discretized to generate first and second winding patterns. The first and second winding patterns are applied to a three dimensional primary coil and the shielding coil respectively.

In accordance with a more limited aspect of the present invention, the first winding pattern lies on a cylindrical surface with outwardly flared ends and the second winding pattern lies on a cylindrical surface.

In accordance with a more limited aspect of the present invention, the shielding coil is made of a conductive material and a harmonic analysis at high frequency is performed to obtain the second continuous current distribution.

In accordance with a more limited aspect of the present invention, the flared ends are conic sections arranged such that they form an angle of between 0 and 90 degrees with a central axis of the cylindrical portion of the primary coil.

In accordance with a more limited aspect of the present invention, the method further includes discretizing the first continuous current distribution to obtain a discrete current pattern, and applying the Biot-Savart law to the discrete current pattern to verify its validity.

In accordance with a more limited aspect of the present invention, a maximum of the fringe magnetic field in the area outside the region defined by the shielding coil is less than 50 $\mu$T.

In accordance with another aspect of the present invention, a method of designing a shielded gradient coil assembly having an inner, primary winding lying on a cylinder with flared ends and a cylindrical outer, shield winding, both of finite length is provided. The method includes defining a first target magnetic field distribution within the primary winding. A first continuous current distribution is defined lying on the cylinder with flared ends having a length and diameter of the primary winding and is applied to the primary winding with flared ends. The first continuous current distribution is derived by minimizing a quadratic current functional which contains stored magnetic energy and magnetic field. A finite element analysis is performed using the first continuous current distribution of the primary winding as a load and via harmonic analysis a second continuous current distribution is obtained lying on a shield cylinder having the length and diameter of the shield cylindrical winding. The first and second continuous current distributions are discretized. Primary windings lying on the cylinder with flared ends and cylindrical shield windings are created with the discretized first and second current distributions.

In accordance with a more limited aspect of the present invention, the shield cylinder has flared portions at its ends.

In accordance with a more limited aspect of the present invention, the first target magnetic field is a linear magnetic field gradient.

In accordance with a more limited aspect of the present invention, the primary and shield cylinders have a common length.

In accordance with a more limited aspect of the present invention, the primary and shield cylinders are circularly symmetric.

In accordance with a more limited aspect of the present invention, a shielded coil assembly designed by the method above.

In accordance with another aspect of the present invention, a magnetic resonance scanner includes a main magnet for generating a main magnetic field through an examination region. The main magnet is arranged such that its geometry defines the examination region. A couch supports a subject to be examined within the examination region. A radio frequency coil is disposed adjacent the examination region for transmitting radio frequency signals into the examination region and selectively exciting dipoles disposed therein. A radio frequency transmitter drives the radio frequency coil. A receiver receives magnetic resonance signals from resonating dipoles within the examination region. An image processor reconstructs an image representation from the received magnetic resonance signals for display on a human readable display. The scanner also includes a gradient coil assembly for generating substantially linear magnetic gradients across the main magnetic field. The gradient coil assembly includes at least one cylindrical primary coil assembly with flared ends disposed about the examination region including an array of conductive coil loops arranged on a finite former such that a current density flowing thereon generates the substantially linear magnetic gradients. The gradient coil assembly also includes at least one cylindrical secondary coil assembly disposed about the primary coil assembly between the primary coil assembly and the main magnet including an array of conductive coil loops arranged on a finite former such that a current density flowing thereon substantially cancels magnet flux density outside an area defined by the secondary coil assembly. The current density of the secondary coil assembly counters eddy currents that would be generated in the secondary coil assembly by the primary coil assembly.

In accordance with a more limited aspect of the present invention, the formers are hollow cylindrical tubes, the former for the primary coil assembly having flared ends, arranged such that the examination region is defined inside the former of the primary coil assembly with the former of the primary coil assembly positioned inside the former of the secondary coil assembly. The axial length of the secondary coil assembly is substantially equal to or less than that of the primary coil assembly.

In accordance with a more limited aspect of the present invention, a maximum magnetic flux density outside the area defined by the secondary coil assembly is less than 50 $\mu$T.

In accordance with a more limited aspect of the present invention, the current density at axial ends of the cylindrical secondary coil assembly is greater that at a center.

In accordance with a more limited aspect of the present invention, the gradient coil assembly includes three primary coil assembly and secondary coil assembly pairs for generating substantially linear magnetic gradients along three mutually orthogonal axes.

In accordance with another aspect of the present invention, a method of designing an active electromagnetic shield for a given three dimensional current distribution is provided. A surface having finite dimensions is defined around the three dimensional current distribution and a fringe magnetic field outside the surface generated as a result of the three dimensional current distribution is determined. The eddy current effects created by the fringe magnetic are calculated and finite element analysis is employed to calculate a current distribution confined to the surface which substantially cancels the fringe magnetic field and eliminates the eddy current effects.

One advantage of the present invention resides in the ability to design shielded gradient coil assemblies for short magnet geometries which improve patient access and reduce patient claustrophobia.

Another advantage of the present invention resides in providing electromagnetic shielding for a three dimensional current distribution.

Another advantage of the present invention is reduced eddy current effects in the vicinity of the imaging region.

Another advantage of the present invention resides in the production substantially linear magnetic gradients with relatively high strengths and increased slew rates.

Another advantage of the present invention is that it permits the calculation of current patterns for a finite shielding coil without the use of current truncation or apodization mechanisms.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
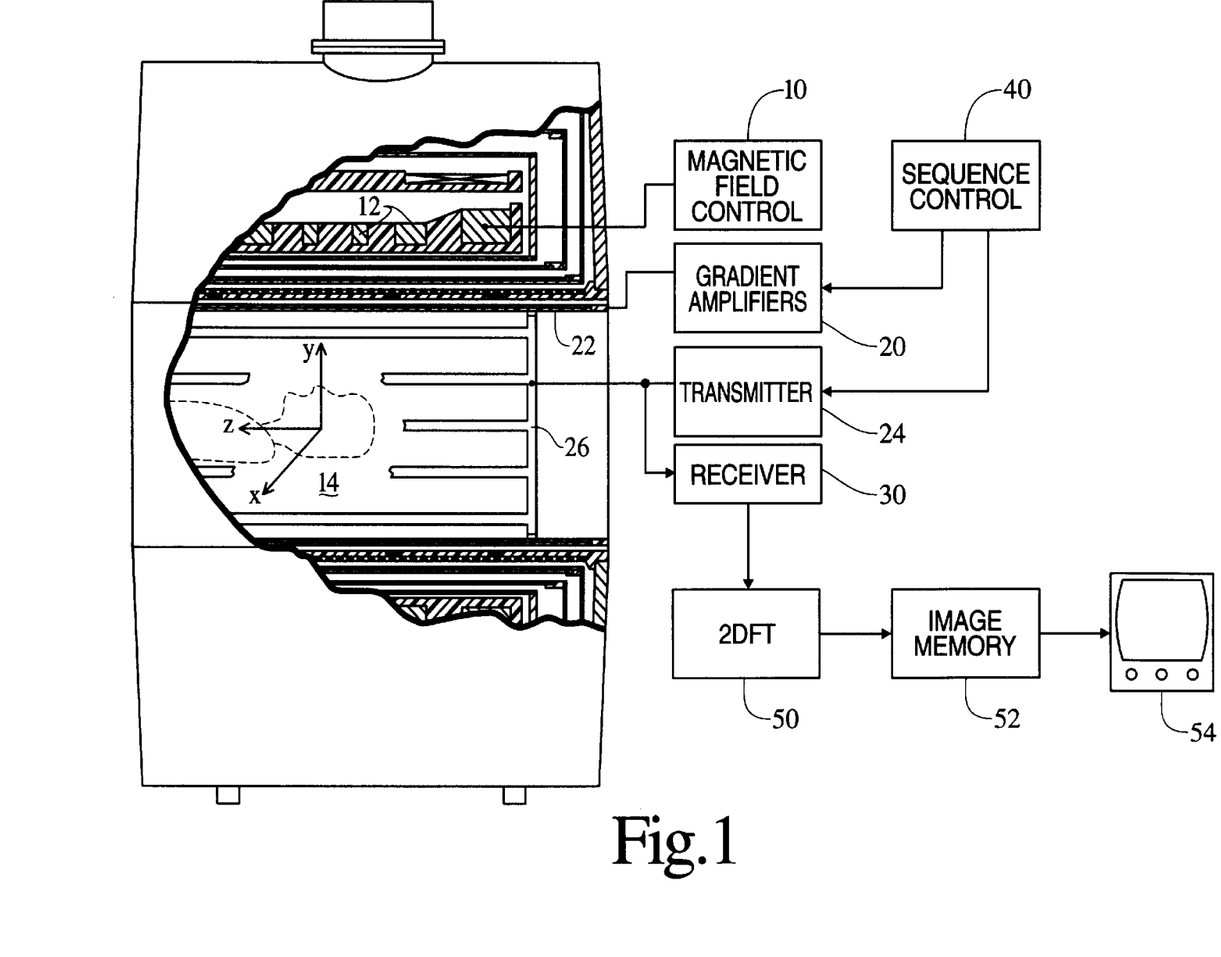
FIG. 1 is a diagrammatic illustration of a magnetic resonance imaging apparatus including a shielded gradient coil assembly designed in accordance with the present invention.

With reference to FIG. 1, a main magnetic field control 10 controls superconducting or resistive magnets 12 such that a substantially uniform, temporally constant main magnetic field is created along a z axis through an examination region 14. A couch (not illustrated) suspends a subject to be examined within the examination region 14. A magnetic resonance echo means applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectrography sequences. More specifically, gradient pulse amplifiers 20 apply current pulse to selected ones or pairs of gradient coil assemblies 22 to create magnetic field gradients along x, y, and z axes of the examination region 14. A digital radio frequency transmitter 24 transmit radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body RF coil 26.

For generating images of local regions of the subject, specialized radio frequency coils are placed continuous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by whole-body coil RF transmissions. The resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two dimensional Fourier transform or other appropriate reconstruction algorithm. The image may represent a planar slice through the patient, an array of parallel planar slices, a three dimensional volume, of the like. The image is then stored in an image memory 52 where it may be accessed by a display, such as a video monitor 54 which provides a human readable display of the resultant image.

Heretofore, the conventional design for shielded gradient coil assemblies has generally been based upon the assumption that the total length of the shielding coil is unrestricted and thus its current density is assumed as infinitely extended. Consequently, as "infinite" shielding coils are not available for practical applications, the current density was subsequently apodized or truncated to fit on appropriate finite length elements. On the other hand, the technique employed herein involves the design of a shielded gradient coil configuration whereby the current for the shielding coil is initially restricted within the boundaries of a shielding coil having a finite length.

Figure 2A:
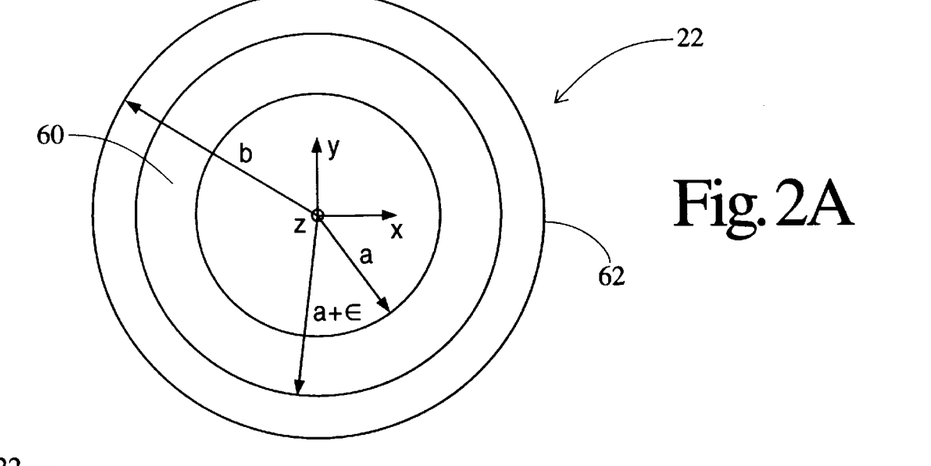
FIGS. 2A and 2B are diagrammatic illustrations of a shielded gradient coil assembly designed in accordance with the present invention.
Figure 2B:
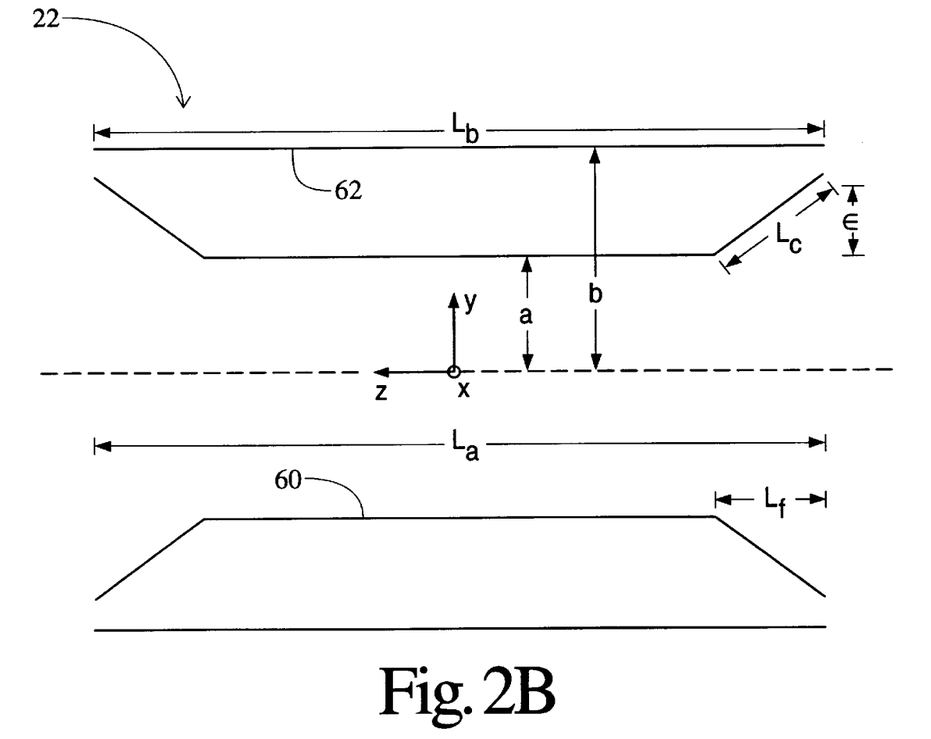

With reference to FIGS. 2A and 2B, the geometrical configuration of the shielded gradient coil assembly 22 designed such that the current density is initially contained within the finite boundaries of the shielding coil is shown. For this configuration, the length of the primary coil 60 is denoted as $L_a$, the axial length of the flared portion is denoted as $L_f$, the length of the flared portion along its surface is defined as $L_c$, and the length of the secondary coil 62 is denoted as $L_b$. The radius of the cylindrical portion of the primary coil 60 is denoted as a while the radius of the shielding coil 62 is denoted as b.

The flared portion of the primary coil is a conical surface with starting radius a and final radius a+ε. Each combination of $L_c$, $L_f$, and ε defines a distinct conical surfaces.

The design of a gradient coil where the z component of the magnetic field varies substantially linearly along the x direction (a transverse gradient coil or x-gradient coil) initially involves the design of the primary coil 60 based on an inverse approach methodology. Initially, the current of the primary coil is modeled to lie on a 2D cylindrical surface. For this x-gradient coil, the gradient magnetic field is anti-symmetric in the x direction around the geometric center of the coil, while it is symmetric along the y and z directions. To generate such a gradient magnetic field, the analytical expression of the electrical current for the primary coil can be written as:

$$\vec{J}^a(\vec{r}) = [j_\phi^a(\phi, z)\hat{\alpha}_\phi + j_z^a(\phi, z)\hat{\alpha}_z]\delta(\rho - a) \quad (1),$$

where $\delta(\rho - a)$ is the restriction that confines the electrical current on a cylinder surface with radius a. The restriction to the primary coil length $L_a$, the confinement of the current density on the cylindrical surface, the azimuthal and axial symmetries for the $j_\phi^a$ and $j_z^a$ and the demand that the current density obeys the continuity equation provides the Fourier series expansion for both components of the current density around the geometric center of the coil as follows:

$$j_\phi^a(\phi, z) = \cos\phi \sum_{n=1}^{\infty} j_{\phi n}^a \cos(k_n z) \quad \text{for } |z| \leq \frac{L_a}{2}, \quad (2)$$

$$j_z^a(\phi, z) = \sin\phi \sum_{n=1}^{\infty} \frac{j_{\phi n}^a}{k_n a} \sin(k_n z) \quad \text{for } |z| \leq \frac{L_a}{2}, \quad (3)$$

where $j_{\phi n}^a$ are the Fourier coefficients, $L_a$ represents the total length of the primary coil, and $k_n = 2n\pi/L_a$ since the electrical current cannot flow off the ends of the cylinder. Furthermore, both current components are zero for $|z| > L_a/2$.

Expressing the z component of the magnetic field $B_z$ and the stored magnetic energy $W_m$ in terms of either one of the two components of the current density, the functional $\mathcal{E}$ in terms of $W_m$ and $B_z$ is constructed as:

$$\xi(j_n^a) = W_m - \sum_{j=1}^{N} \lambda_j (B_z(\vec{r}_j) - B_{zSC}(\vec{r}_j)), \quad (4)$$

where $\lambda_j$ are the Lagrange multipliers and $B_{zSC}$ represent the constraint values of the z component of the magnetic field at specified N points. Minimizing $\mathcal{E}$, a quadratic function of the current, with respect to the current coefficients $j_{\phi n}^a$ obtains a matrix equation which $j_{\phi n}^a$ satisfies:

$$\sum_{n'=1}^{\infty} j_{\phi n'}^a \left\{ \frac{aL_a\pi}{2} \int_{-\infty}^{\infty} dk\, I_1'(ka) K_1'(ka) \psi_n(k) \psi_{n'}(k) \right\} = \quad (5)$$

$$\sum_{j=1}^{N} \lambda_j \cos(\phi_j) \int_{-\infty}^{\infty} dk\, k \cos k z_j I_1(k\rho_j) K_1'(ka),$$

where the evaluation of the Lagrange multipliers is done by way of the constraint equation. Inverting the matrix equation, a solution for $j_{\phi n}^a$ obtained and, hence, the solution for the current density is obtained as well. Replacing this expression back into the stored energy and magnetic field formulas, a final expression for the stored magnetic energy and the magnetic field is acquired in terms of the constraint points and the geometry of the system. In this manner, the form of the continuous current distribution along the azimuthal and axial directions for the primary coil 60 is generated.

In one embodiment for the design of the primary x-gradient coil, the radius a of the cylinder is equal to 0.342138 m and its total length $L_a$ is restricted to 1.32700 m. Four Fourier coefficients were employed to specify the behavior of the current density. Furthermore, three constraint points were employed to control the field behavior inside a 45 cm imaging volume. Table 1 lists the constraint set used for designing the primary gradient coil 60.

TABLE 1

Constraint set used for the design of the primary gradient coil.
Values for ρ and z are in meters, values for $B_{zSC}(2n)$ are in T.

| n | $\rho_i$ | $z_i$ | $B_{zSC}(2n)$ |
|---|---|---|---|
| 1 | 0.001 | 0.000 | 0.000032700 |
| 2 | 0.225 | 0.000 | 0.007766000 |
| 3 | 0.001 | 0.225 | 0.000026160 |

The first constraint point defines a gradient strength for the primary coil 60 of 32.7 mT/m, the second constraint point specifies a 5% linearity of the gradient field along the gradient x-axis up to a distance of 22.5 cm (the radial distance of the 45 cm imaging volume) from the isocenter of the gradient field, and the third constraint point specifies a 20% uniformity of the gradient field inside the 45 cm imaging volume.

Through the use of these constraints and the application of the inverse approach methodology, the values are obtained for the Fourier coefficients for the current density of the primary coil 60, which determines its continuous current distribution. Next, the continuous current distribution is discretized and the Biot-Savart law is applied to the discrete current pattern in order to verify the validity of the earlier minimization.

Figure 3:
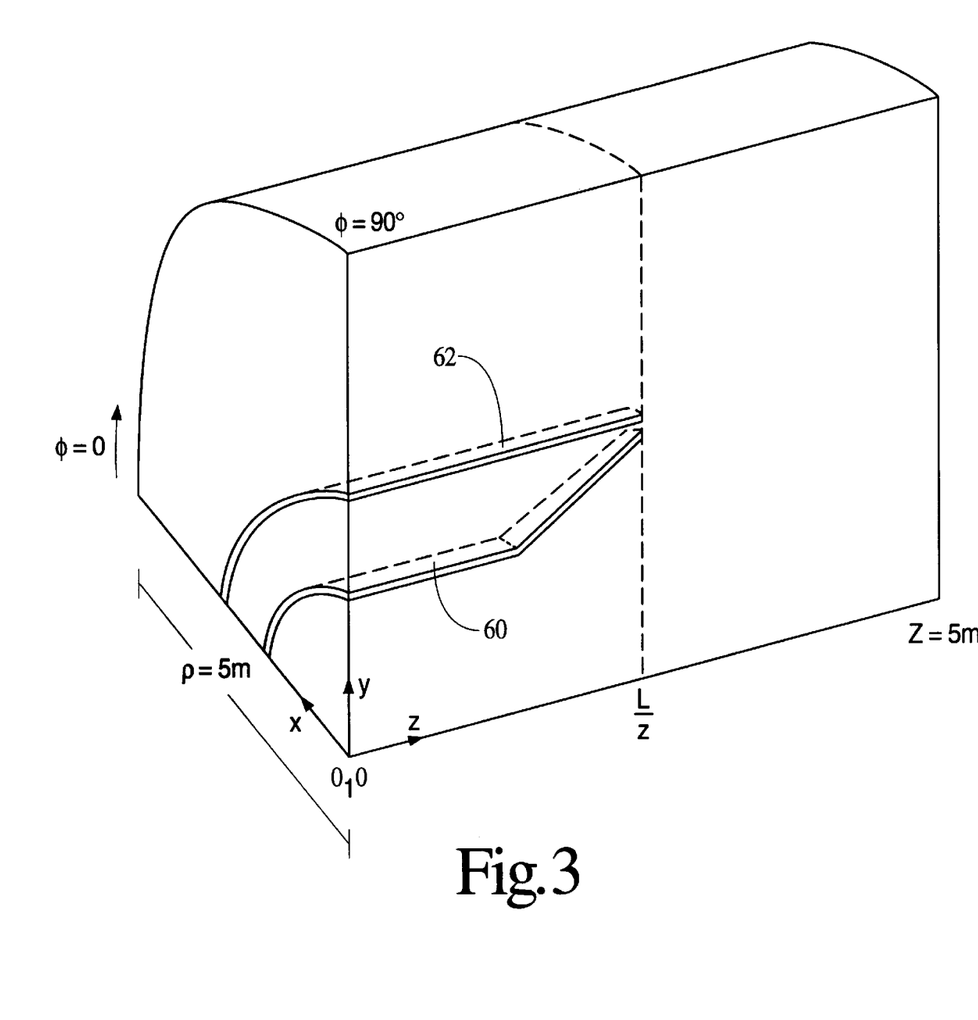
FIG. 3 is a three dimensional model of a portion of a shielded gradient coil assembly employed in the design thereof in accordance with the present invention.

The continuous current distribution generated from the previous analytical method was then applied to the flared surface shown in FIGS. 2A and 2B. Having developed the primary coil 60, the next step is to shield the magnetic field generated thereby with a finite length current distribution using a Finite Element Analysis. Due to symmetry conditions, only one portion needs to be modeled, with the appropriate boundary conditions that ensure correct current behavior for the primary and shielding coils. With reference to FIG. 3, a 3-D finite element model of the gradient coil assembly is illustrated. Again, due to symmetry, only one-half the axial length, z from 0 to $L_a/2$, and one quarter of the angular section, φ from 0° to 90°, is modeled. Additionally, in order to ensure the correct behavior of the magnetic field both inside and outside the gradient coil structures, the finite element model was extended axially to 5.0 m and radially to 2.5 m. At these locations, the vector potential was set to zero. The primary coil 60 is considered as a layer with a cylindrical portion inner radius of 0.34096 m and an outer radius of 0.343320 m. This provides for a mean radius of 0.342138 m which corresponds to the radius a previously determined for the cylindrical portion of the primary coil 60. Hence, the primary coil 60 has a thickness equal to 0.00236 m and a half length, $L_a/2$, of 0.6635 m. The flared portion is defined by a cone with an axial length $L_f=0.2$ m and a length along the surface of the cone $L_c=0.211$ m. The mean starting radius of the cone is set to 0.342138 m to correspond with the radius a of the cylindrical section of the primary coil 60. The mean ending radius a +δ=0.410818 m and the thickness of the conductor in the conical flared portion is set at 0.002364 m.

Figure 4:
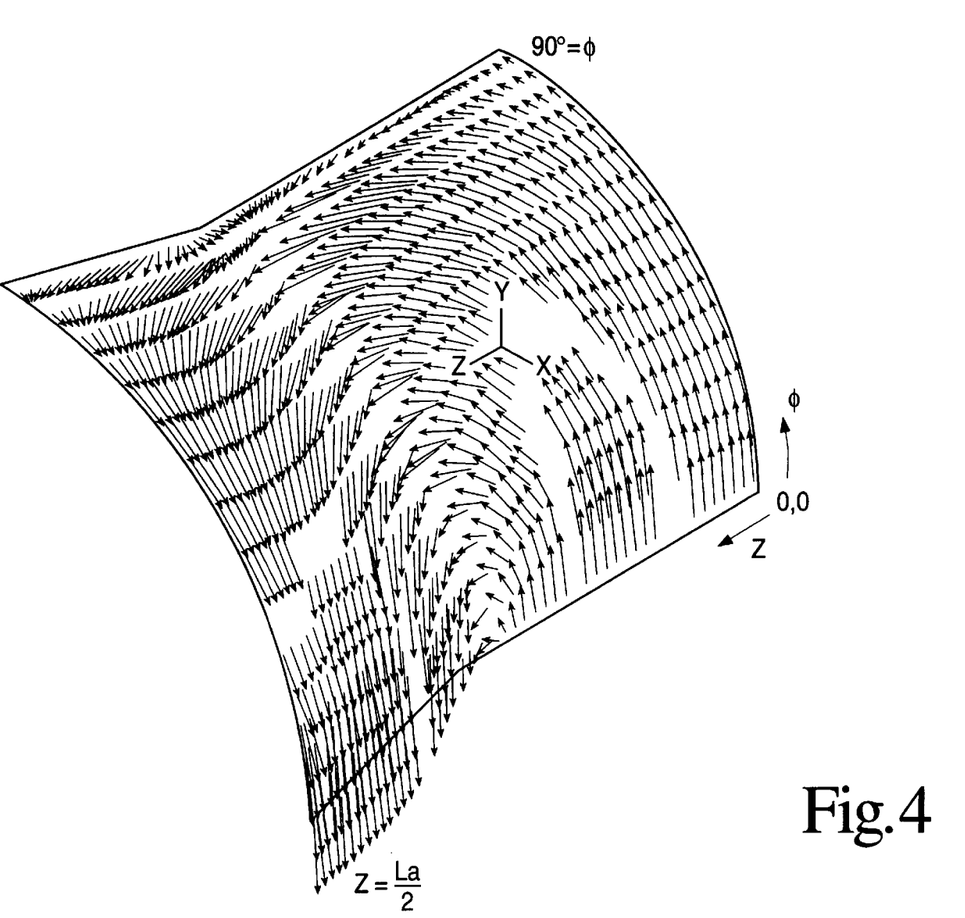
FIG. 4 is a vector plot of the current distribution of the portion of the primary coil modeled in FIG. 3 designed in accordance with the present invention.
Figure 5:
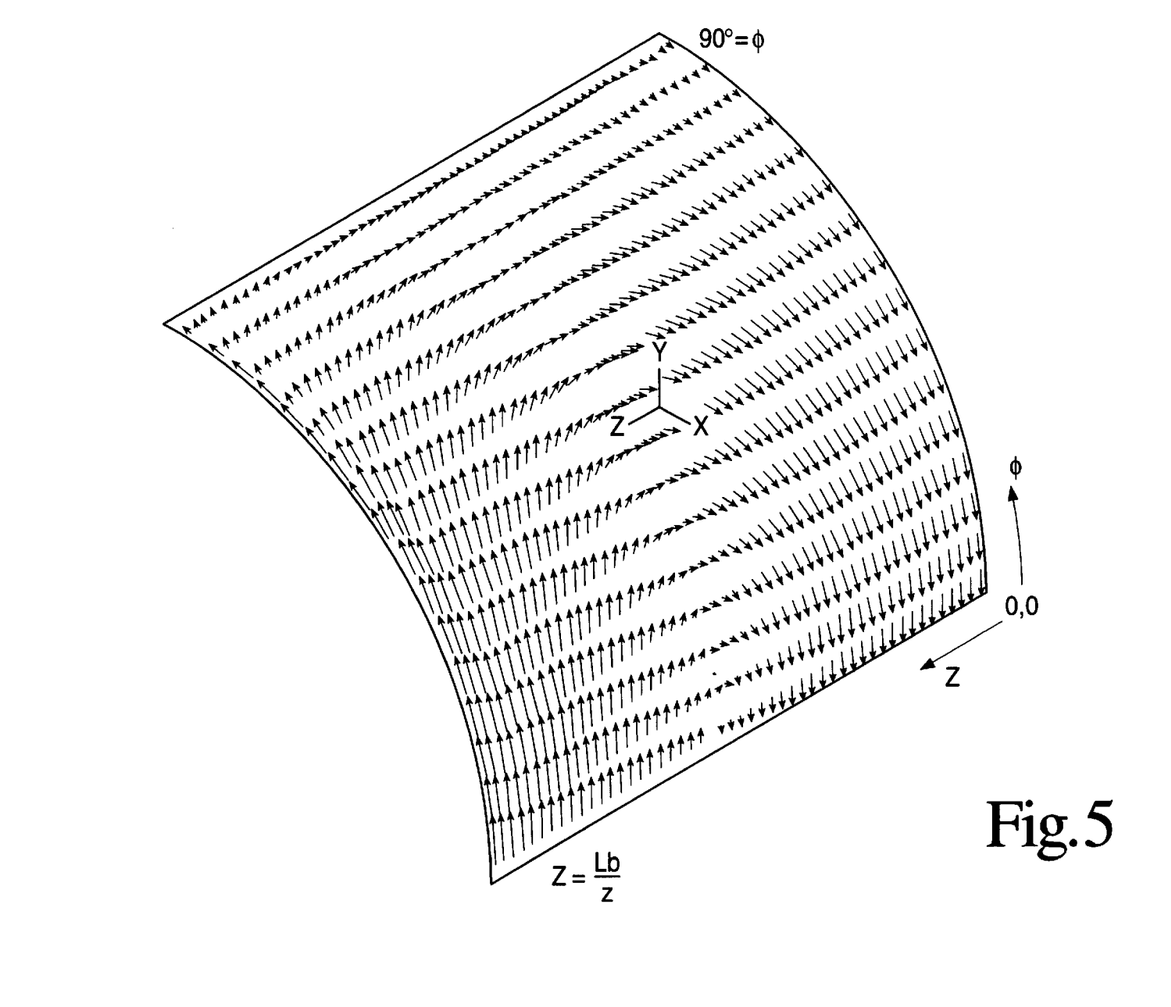
FIG. 5 is a vector plot of the current distribution of the portion of the shielding coil modeled in FIG. 3 designed in accordance with the present invention.
Figure 6:
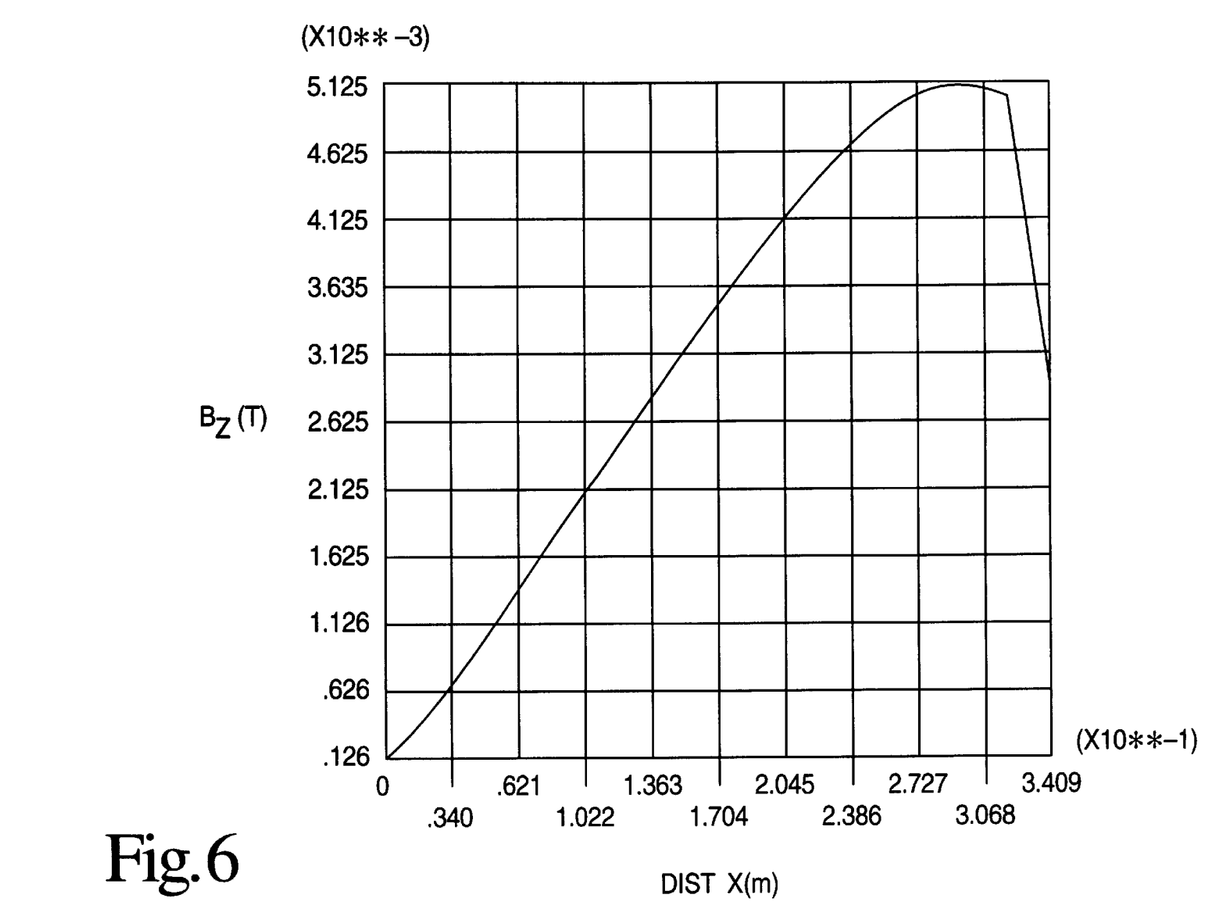
FIG. 6 is a plot of the z component of the gradient magnetic field in Tesla versus distance along the x axis in meters in the region inside the primary coil at an axial position z=0 m produce by the gradient coil assembly modeled in FIG. 3 design in accordance with the present invention.
Figure 7:
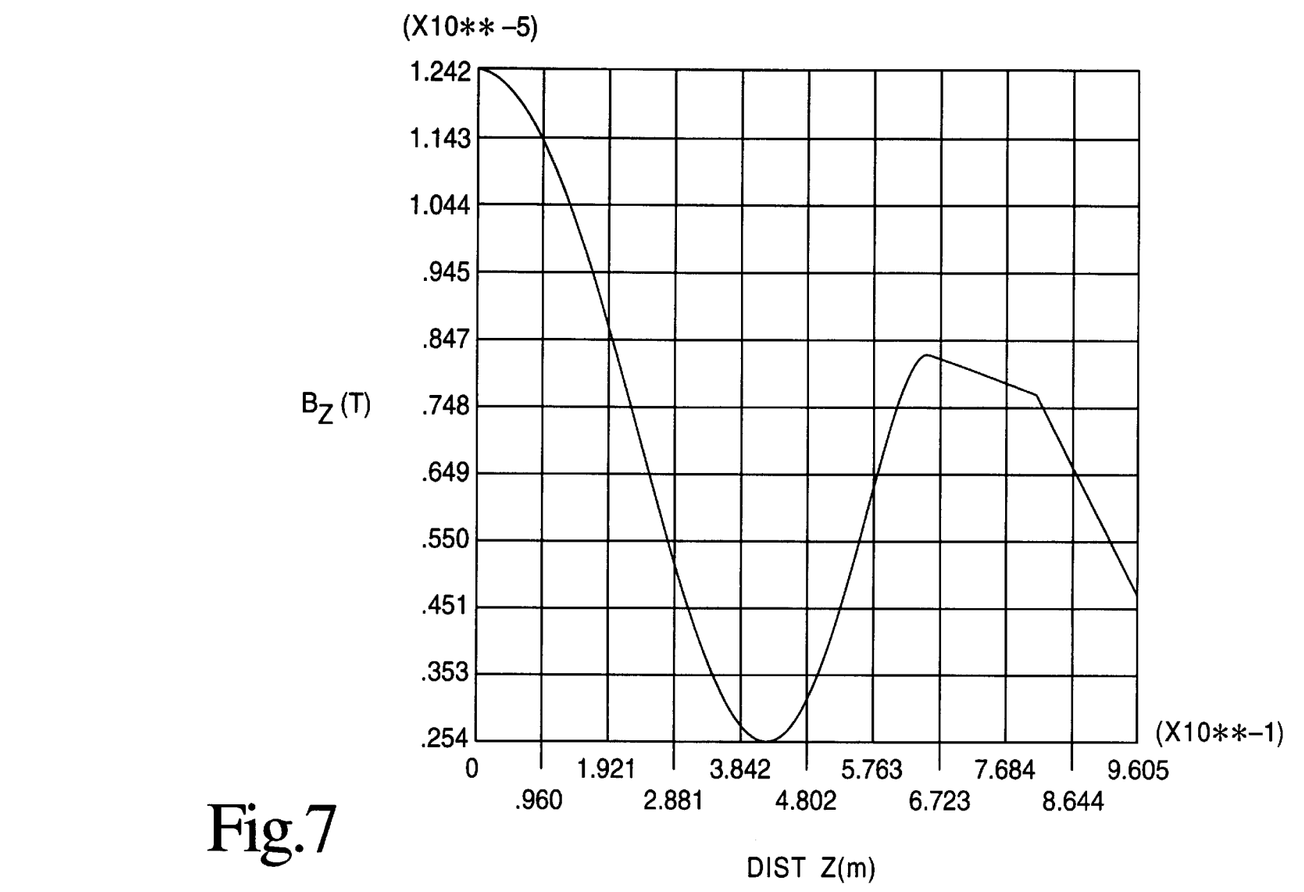
FIG. 7 is a plot of the z component of the fringe gradient magnetic field in Tesla versus distance along the z axis in meters at a radial position $\rho$=0.485 m produce by the gradient coil assembly modeled in FIG. 3 design in accordance with the present invention; and, FIG. 8 is a plot of the z component of the fringe gradient magnetic field in Tesla versus distance along the z axis in meters at a radial position $\rho$=0.485 m produce by an unflared shielded gradient coil assembly designed with a truncated infinitely extended shielding current.

The secondary coil has an inner radius of 0.432354 m and an outer radius of 0.433354 m while its half length, $L_b/2$, is 0.663504 m. In this embodiment, the half length of both the primary and secondary coils are chosen to be substantially identical. However, the finite element analysis code has been set in a parametric way which permits changes to the dimensions of the primary and secondary coils to fit within desired design parameters. Given the dimensions of the layer that corresponds to the primary coil 60, the current load using the Fourier coefficient expansion as it was previously derived is applied thereto. FIG. 4 illustrates the current pattern behavior for the primary coil 60. To find the appropriate current pattern which will shield the primary coil's magnetic field and will flow within the boundaries of the secondary coil's layer, the finite element problem is approached as an eddy current problem. The material for the shielding coil's layer is taken to be copper with a resistivity of $1.76 \times 10^{-8}$ Ω-m at 25° C. Performing a harmonic analysis with a frequency of 0.1 MHZ, or other appropriate high frequency, the solution for the current pattern of the shielding coil is obtained as shown in FIG. 5. Note, the high frequency is chosen in order to avoid skin depth effects. In this manner, the shielding coil 62 is designed such that the fringe magnetic field generated by the primary coil 60 is substantially canceled in a region outside the area defined by the secondary coil 62. Next, the z component of the magnetic field along the gradient x direction is evaluated inside the region defined by the primary coil 60 to ensure the quality of the gradient magnetic field. FIG. 6 plots the resulting total gradient (including the shielding coil's contribution) generated as the z component of the gradient magnetic field versus the distance along the x axis in the region inside the primary coil 60. The resulting total gradient strength is calculated to be 19.3 mT/m with an 8.8% linearity at a radial location of 0.2386 m from the isocenter of the coil and a gradient strength of 21 mT/m at the isocenter. With reference to FIG. 7, the shielding behavior of the shielded gradient coil assembly 22 is evaluated at the region outside the shielding coil and at a radial location of ρ=0.485 m. As FIG. 7 illustrates, the net fringe magnetic field maximum occurs at the coil's isocenter and has a value of approximately 12.4 μT.

Figure 8:
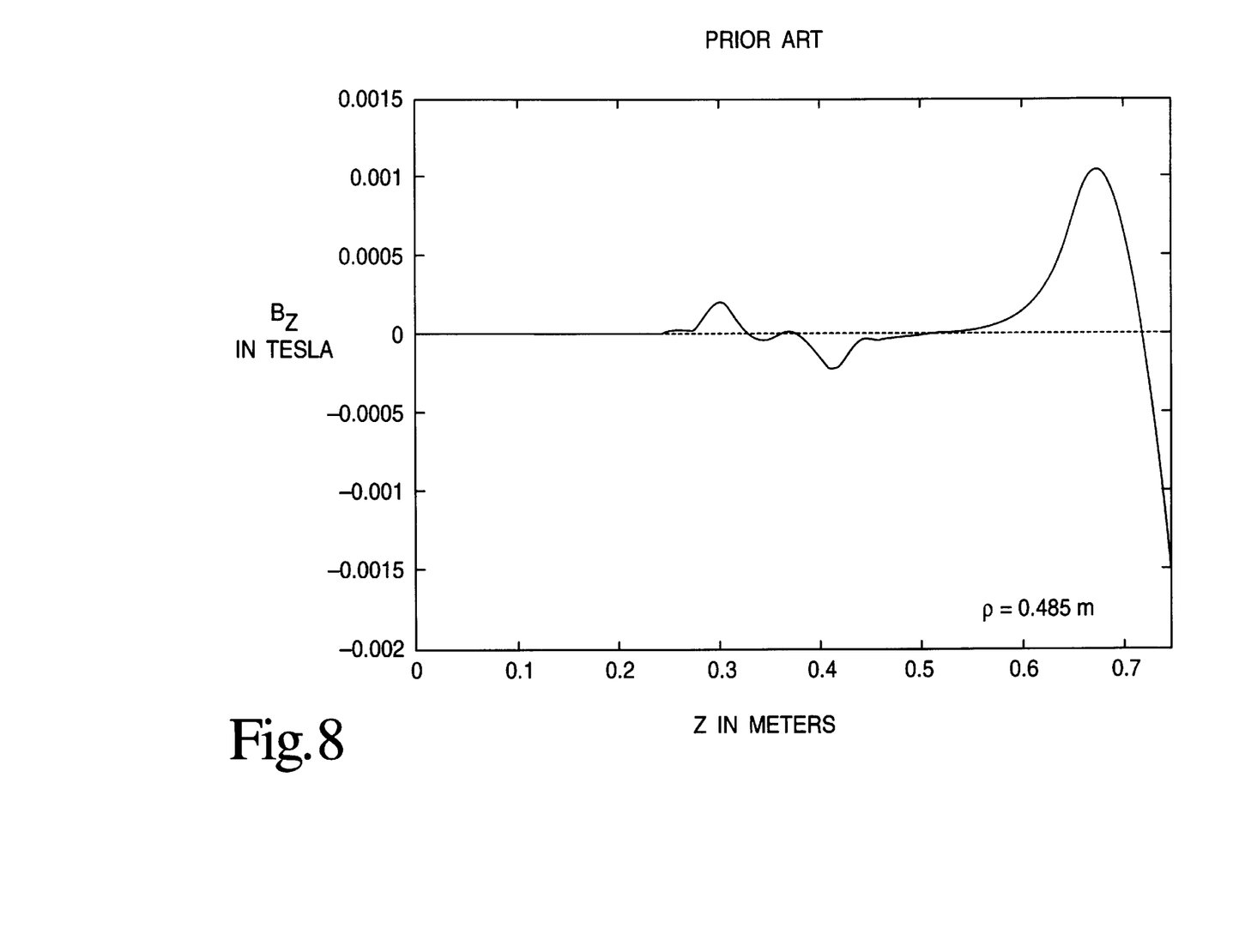

With reference to FIG. 8, an evaluation of the fringe magnetic field outside the shielding coil for a conventionally designed coil having a truncated infinite shield current as previously described and having no flared ends on the primary coil is illustrated. The shielding coil in this case is dimensionally similar to the one designed using the finite element analysis previously described but was designed with an infinitely extended current that was truncated to fit an axial half length of 0.8 m. At a radial location of ρ=0.485 m, the coil designed with the truncated infinitely extending current has a fringe magnetic field maximum of 1.05 mT which occurs at an axial distance of 0.68 m from the isocenter of the coil. In the case of a primary coil having flared ends, the shielding characteristics obtained from the truncation method are worse still. In comparison, the employment of the hybrid technique combining the inverse method and finite element analysis as described herein as opposed to the employment of the conventional truncation of an infinitely extended shielding current results in a reduction of the gradient coil's total fringe magnetic field by a factor of approximately 100.

The design of the y-gradient shielded gradient coil assembly receives the identical treatment as that of the x-gradient coil merely rotated 90° about a central axis. Similarly, the z-gradient coil receives a like treatment with slight variation. Further, while the shielded gradient coil assembly herein has been described with reference to particular geometric boundaries and parameters, it is to be appreciated that various sizes, lengths, and geometric configurations of shielded gradient coil assemblies may be designed to meet the constraints of numerous applications. For example, the specified current patterns can be changed to produce either better linearity at the price of coil efficiency or greater efficiency at the price of linearity. The dimensions of the cylindrical gradient coil can be changed to be larger or smaller according to preferred applications. Another alternate embodiment includes the design of shielding coils where the length of the shielding coil is smaller than the length of the primary coil. As well, the gradient coil assembly may be designed such that net thrust forces generated as a result of the interaction of non-uniformities in the main magnetic field and currents flowing through the gradient coil assembly are balanced for each primary and shielding coil set. Furthermore, it is to be appreciated that while described with reference to magnetic resonance imaging systems having central bore examination regions, the design technique is also applicable to open type magnetic resonance imaging apparatus having axial and/or vertically directed fields.

The invention has been described with reference to the preferred embodiments. obviously, modifications and alterations will occur to others upon reading and understanding the preceding detailed description. It is intended that the invention be construed as including all such modifications and alterations insofar as they come within the scope of the appended claims and/or equivalents thereof.

Having thus described the preferred embodiments, the invention is now claimed to be:

1. A method of designing shielded gradient coil assemblies for magnetic resonance imaging systems, said method comprising:

(a) calculating a first continuous current distribution for a three dimensional construction using an inverse approach such that the first continuous current distribution is confined within predetermined finite geometric boundaries of the three dimensional construction and generates a magnetic gradient field across an imaging region, said magnetic gradient field being constrained to predetermined values at specified spatial locations within the imaging region;

(b) calculating a second continuous current distribution for a shielding coil using finite element analysis such that the second continuous current distribution is confined within predetermined finite geometric boundaries of the shielding coil, such that the second continuous current distribution generates a magnetic field which substantially cancels in an area outside a region defined by the shielding coil a fringe magnetic field generated by the first continuous current distribution.

2. The method according to claim 1 further including:

discretizing the first and second continuous current distributions to generate first and second winding patterns;

applying the first winding pattern to a three dimensional primary coil; and applying the second winding pattern to the shielding coil.

3. The method according to claim 1, wherein the shielding coil is made of a conductive material and a harmonic analysis at high frequency is performed to obtain the second continuous current distribution.

4. The method according to claim 1, further including after step (a):

discretizing the first continuous current distribution to obtain a discrete current pattern; and, applying the Biot-Savart law to the discrete current pattern to verify its validity.

5. The method according to claim 1, wherein a maximum of the fringe magnetic field in the area outside the region defined by the shielding coil is less than 50 $\mu T$.

6. A method of designing shielded gradient coil assemblies for magnetic resonance imaging systems comprising:

(a) calculating a first continuous current distribution which lies continuously along a first continuous cylindrical surface with outwardly flared outer ends such that the first continuous current distribution is confined continuously along the cylindrical surface with outwardly flared ends surrounding an imaging region and generates a magnetic gradient field across the imaging region, the magnetic gradient field constrained to predetermined values at specified spatial locations within the imaging region;

(b) calculating a second continuous current distribution for a shielding coil which lies a second continuous cylindrical surface that surrounds the first cylindrical surface.

7. The method according to claim 6, wherein the shielding coil has an axial length substantially equal to or less than that of the primary coil.

8. The method according to claim 6, wherein the flared ends are conic sections arranged such that they form an angle of between 0 and 90 degrees with a central axis of the cylindrical portion of the primary coil.

9. A method of designing a shielded gradient coil assembly having an inner, primary winding lying on a cylinder with flared ends and a cylindrical outer, shield winding, both of finite length, the method comprising:

(a) defining a first target magnetic field distribution within the primary winding;

(b) defining a first continuous current distribution lying on the cylinder with flared ends having a length and diameter of the primary winding and applying it to the primary winding with flared ends;

(c) minimizing a quadratic current functional which contains stored magnetic energy and magnetic field to derive the first continuous current distribution;

(d) performing a finite element analysis using the first continuous current distribution of the primary winding as a load and via harmonic analysis obtaining a second continuous current distribution lying on a shield cylinder having the length and diameter of the shield cylindrical windings;

(e) discretizing the first and second continuous current distributions; and, (f) creating primary windings lying on the cylinder with flared ends and cylindrical shield windings with the discretized first and second current distributions.

10. The method as set forth in claim 9 wherein the shield cylinder has flared portions at its ends.

11. The method as set forth in claim 10 wherein the first target magnetic field is a linear magnetic field gradient.

12. The method as set forth in claim 9 wherein the primary and shield cylinders have a common length.

13. The method as set forth in claim 9 wherein the primary and shield cylinders are circularly symmetric.

14. A shielded coil assembly designed by the method of claim 9.

15. A method of designing an active electro-magnetic shield for a given three dimensional current distribution comprising:

(a) defining a surface having finite dimensions around the three dimensional current distribution;

(b) determining a fringe magnetic field outside the defined surface generated as a result of the three dimensional current distribution;

(c) calculate eddy current effects created by the fringe magnetic field; and, (d) employing finite element analysis to calculate a current distribution confined to the defined surface which substantially cancels the fringe magnetic field and eliminates the eddy current effects.

* * * * *